United States Patent [19]
Nogami

[11] Patent Number: 5,267,192
[45] Date of Patent: Nov. 30, 1993

[54] SEMICONDUCTOR MEMORY DEVICE

[75] Inventor: Kazutaka Nogami, Tokyo, Japan

[73] Assignee: Kabushiki Kaisha Toshiba, Kawasaki, Japan

[21] Appl. No.: 753,048

[22] Filed: Aug. 30, 1991

[30] Foreign Application Priority Data

Sep. 4, 1990 [JP] Japan ................................. 2-232415

[51] Int. Cl.$^5$ ............................................. G11C 13/00
[52] U.S. Cl. ........................................ 365/154; 365/175
[58] Field of Search ................... 365/154, 175, 189.01, 365/230.01, 182

[56] References Cited

U.S. PATENT DOCUMENTS 4,023,148  5/1977  Heuber et al. ....................... 365/175

Primary Examiner—Terrell W. Fears
Attorney, Agent, or Firm—Foley & Lardner

[57] ABSTRACT

A semiconductor memory device having a plurality of memory cells, each memory cell having two nodes, an electric potential of each node designates a stored data, comprises: a word line; a pair of bit lines; a pair of field effect transistors (FETs) connected between the word line and the nodes; a pair of diodes connected between the bit lines and the nodes; a pair of load means connected between the nodes and a first potential; and an inverter connected to the word line for driving the FETs, wherein the electrical potential of the nodes are read out by the change of the potential of the word line controlled by the inverter.

10 Claims, 7 Drawing Sheets

: EMBEDDED CONTACT FORMED SINGLE-POLY DIFFUSION LAYER

: CONTACT FORMED BY SINGLE-POLY AND 2-POLY DIFFUSION LAYER

: CONTACT FORMED BY 3-POLY DIFFUSION LAYER (FOR FORMING DIODE)

: CONTACT FORMED BY ALMINIUM AND DIFFUSION LAYER

SEMICONDUCTOR MEMORY DEVICE

BACKGROUND OF THE INVENTION

1. Field of the Invention

The present invention relates to a semiconductor memory device, and, in particular, to a semiconductor memory device as a memory cell used in a static-type RAM.

2. Description of the Prior Art

The memory cell illustrated in FIG. 1 is an example of a conventional memory cell used in a static-type RAM.

The memory cell shown in FIG. 1 comprises a flip-flop (F/F) in turn comprising a pair of cross-coupled P-channel type metal-oxide semiconductors (MOS) P50, P51 and a pair of N-channel type metal-oxide semiconductors (MOS) N50, N51; and a pair of NMOSs N52, N53 comprising transfer transistors for inputting and outputting recorded data, provided with a gate terminal connected to a word line WL, and positioned between a bit line BL and a bit line $\overline{BL}$.

The cell stability of a memory cell with this configuration is good because the F/F is formed from a CMOS. However, because this configuration uses a PMOS and an NMOS, a well region must be formed within the memory cell. Also, six MOS transistors P50, P51, N50 to N53, are required to form one memory cell. This results in a large memory cell and makes large-scale integration difficult.

There is, however, a conventional memory cell, as shown in FIG. 2, with a smaller cell size than the memory cell with the above-mentioned configuration.

The memory cell of FIG. 2, as opposed to the memory cell of FIG. 1, is a resistance load type memory cell comprising a pair of resistances R51, R52 in place of the PMOSs P50, P51 as load elements.

Because of this configuration, a well region formed within the memory cell is unnecessary, making it possible to reduce the cell size as compared with a CMOS-type memory.

Because the memory cell with this configuration is reduced in size, it is necessary to reduce the size of all the transistors, of the device spacing, and of the contacts, which is extremely difficult. In addition, the reduction of the size of the transistors causes a large substrate bias effect so that the threshold voltage of the transistors rises. For this reason, the potential of the write-in data stored at high level is comparatively low, the charge is reduced, and the soft error rate increases. Accordingly, in order to minimize such soft error rate, a large capacitance is required for a pair of inner nodes ND1, ND2 in which data is stored. Accordingly, this causes the cell size to increase.

Also, in the case where the power voltage drops as the size of the transistor is decreased, the drivability of the NMOSs N50, N51 must be large with respect to the drivability of the NMOSs N52, N53, to maintain the stability of the memory cell. Accordingly, the size of the memory cell is further increased.

In addition to the memory cell using this type of MOS transistor, as shown in FIG. 3, there is a bipolar type of SRAM cell which comprises a pair of bipolar transistors Q1, Q2, a pair of resistances R53, R54, and a pair of diodes D51, D52.

In the memory cell of this configuration, the cell size is reduced in comparison with the two above-mentioned types of memory cells, but use of the bipolar transistor causes the energy consumption to increase so that the large scale SRAM cannot be realized.

As explained above, inconveniences are introduced by using a conventional SRAM, because of the large volume requirements, including difficulties in reducing the required area in a memory cell, reduced reliability because of software errors, and high energy consumption.

SUMMARY OF THE INVENTION

Accordingly, an object of the present invention is to provide, with due consideration to the drawbacks of such conventional devices, an ideal, large-scale, high-density semiconductor memory device which demonstrates no loss of stability, has improved reliability, and requires a smaller cell area.

A semiconductor memory device, according to a preferred embodiment of the present invention, having a plurality of memory cells, each memory cell having two nodes, an electric potential of each node designates a stored data, comprises: a word line; a pair of bit lines; a pair of field effect transistors (FETs) connected between the word line and the nodes; a pair of diodes connected between the bit lines and the nodes; a pair of load means connected between the nodes and a power source; and driving means connected to the word line for driving the FETs. In the semiconductor memory device, the electric potentials of the nodes are read out by the change of the potential of the word line controlled by the driving means.

The stored data is input and output via the diodes, between the node and the bit line, connected to the word line through a cross-coupled drive transistor (MOSFET), under the control of an inverter as the driving means, Accordingly, the cell has high stability, the drive FET can be small, and it is possible to minimize soft error rate when the write potential is high. As a result, a reduction in cell area and an increase in reliability can be provided, so that an ideal semiconductor memory device with a high density can be provided.

Other features of this invention will become apparent in the course of the following description of exemplary embodiments which are given for illustration of the invention and are not intended to be limiting thereof.

DETAILED DESCRIPTION OF THE PREFERRED EMBODIMENTS

An embodiment of the present invention will now be described with reference to the drawings.

Figure 4:
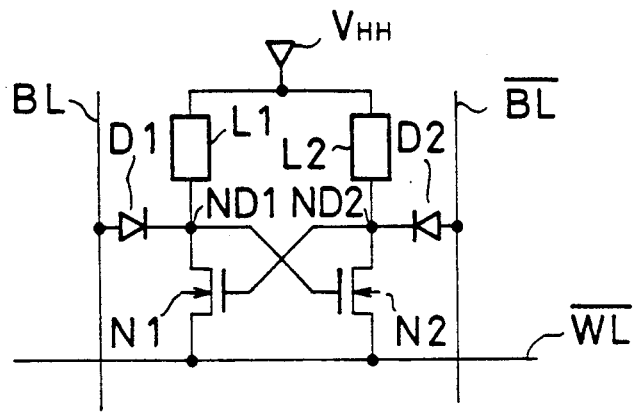
FIGS. 4 to 6 are circuit diagrams of various type of semiconductor memory devices shown as a memory cell according to the present invention.

FIG. 4 shows the circuit configuration for a memory cell which is one embodiment of the semiconductor memory device of the present invention. The memory cell illustrated in FIG. 4 uses a static-type RAM (SRAM) and comprises a pair of NMOSs N1, N2, a pair of diodes D1, D2, and a pair of load elements L1, L2.

The NMOSs N1, N2 are cross-coupled, and are connected respectively to a pair of internal nodes ND1, ND2 corresponding to a pair of gate terminals. A pair of source terminals is connected to a common word line $\overline{WL}$. The anode terminals of the diodes D1, D2 are connected to a corresponding bit line BL and a bit line $\overline{BL}$, and the cathode terminals are connected to the corresponding internal nodes ND1, ND2. The load elements L1, L2 are connected between the internal nodes ND1, ND2 corresponding to a fixed potential VHH which is higher than the power source potential (VHH > VDD).

Figure 5:
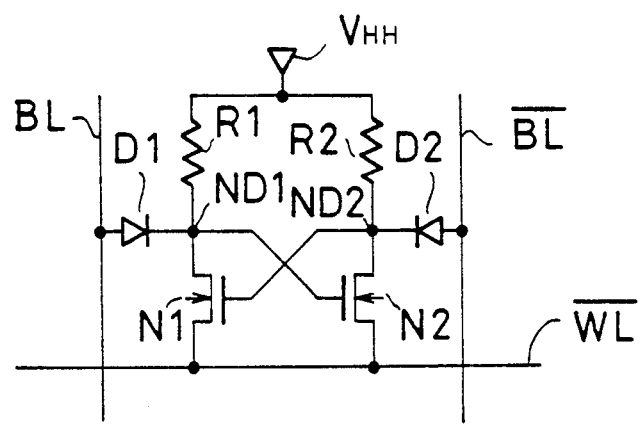
Figure 6:
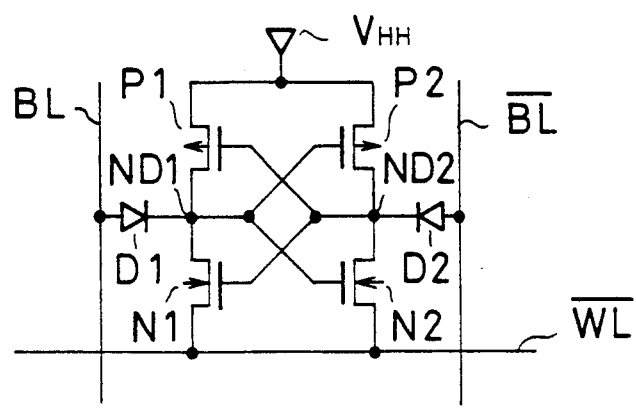

A pair of resistances R1, R2, as shown in FIG. 5, or a pair of PMOSs P1, P2, as shown in FIG. 6 are used as the load elements L1, L2.

Next, the operation of a memory cell with the above-mentioned configuration will be explained for the memory cell which utilizes the PMOSs P1, P2 as the load elements L1, L2, as shown in FIG. 6, as an example.

Figure 7:
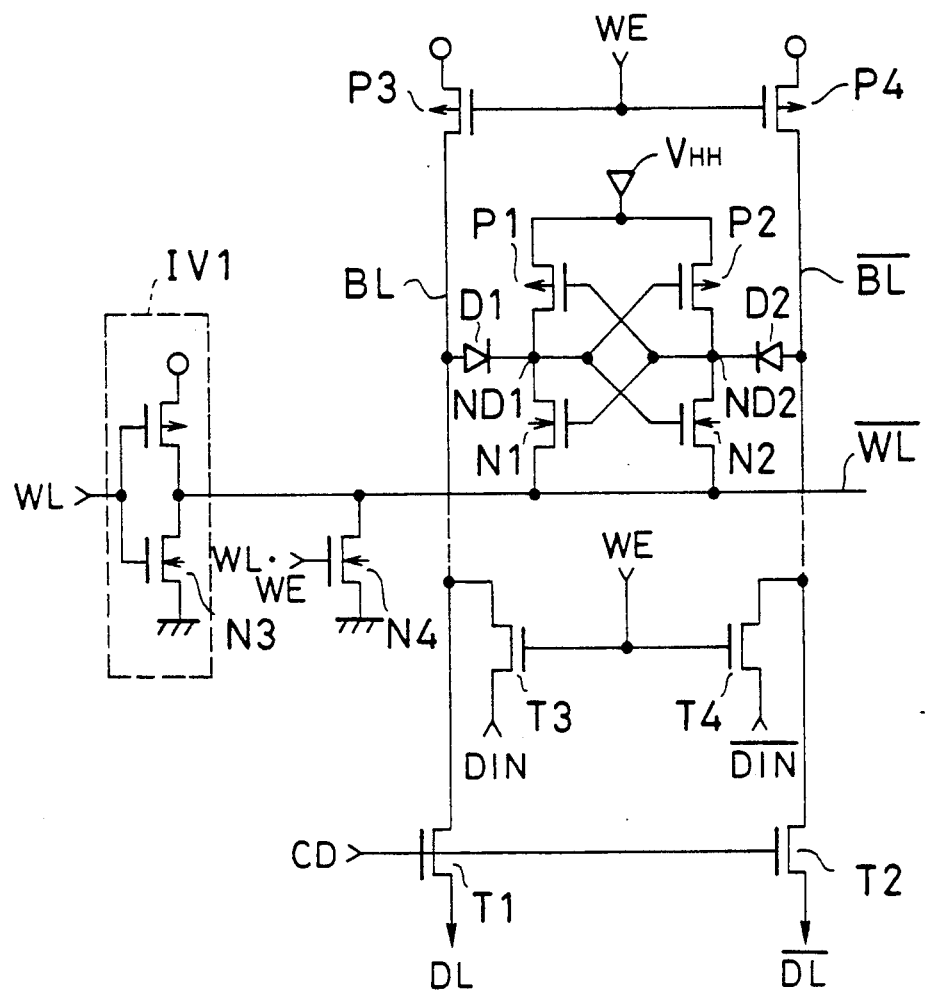
FIG. 7 is a circuit diagram of a semiconductor memory device incorporating the memory cell shown in FIG. 6.
Figure 8:
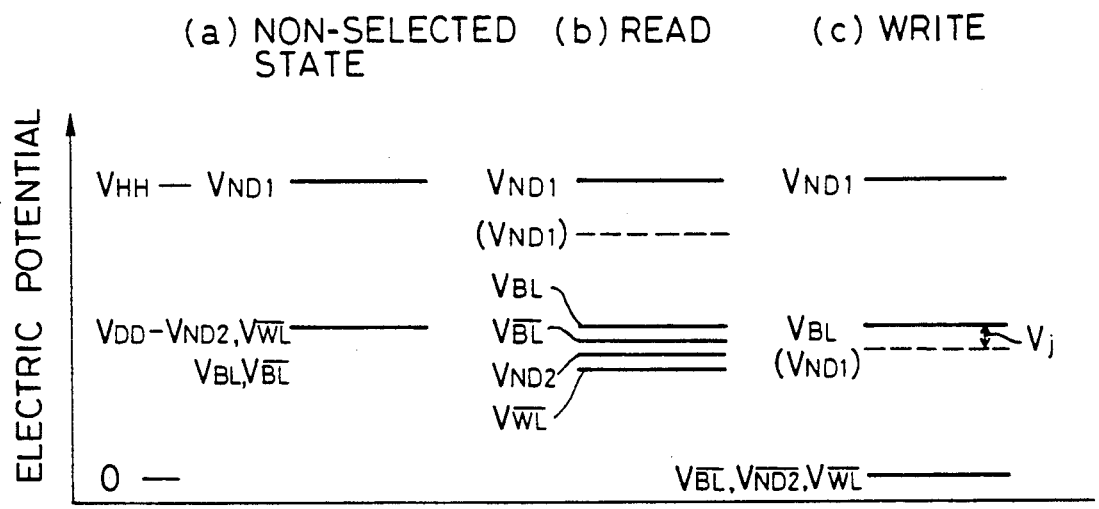
FIG. 8 is a diagram showing a relationship among electric potentials of nodes, bit lines, word lines and the like in a memory cell used in a semiconductor memory device according to the present invention.

FIG. 7 shows the circuit configuration of a peripheral circuit which controls the read/write operation for the memory cell shown in FIG. 6. FIG. 8 shows the levels of the potentials for the word line $\overline{WL}$, the bit lines BL, $\overline{BL}$, and the internal nodes ND1, ND2 during non-selection, read, and write of the memory cell with the circuit shown in FIG. 7.

In FIG. 7, the bit lines BL, $\overline{BL}$ are precharged by means of a pair of PMOSs P3, P4 controlled in accordance with a write enable (WE) signal. The data written on the bit lines BL, $\overline{BL}$ is provided to a sense amplifier (omitted from the drawings) connected to a pair of data lines DL, $\overline{DL}$ through a pair of transfer gates T1, T2 and is read externally. Write data (DIN, $\overline{DIN}$) is provided to the bit lines BL, $\overline{BL}$ through a pair of transistors T3, T4.

The word line $\overline{WL}$ is drive controlled by an inverter circuit IV1 as a driving means, which inputs a word line selection signal for selecting one of a plurality of word lines, and is driven in a low-level state by an NMOS N4 during write.

In a circuit with this type of configuration, the memory cell enters the non-selected state when the word line $\overline{WL}$ is at the power source potential level (VDD'). When this occurs, the internal node ND1 of the memory cell is at the VHH level (>VDD) and the internal node ND2 of the memory cell is at the VDD level. The relationships of the potentials of the word line $\overline{WL}$, the bit lines BL, $\overline{BL}$, and the internal nodes ND1, ND2 in the memory cell in this state are shown in FIG. 8(a). The F/F of the memory cell maintains the memory state between the VHH level and the VDD level. When the potential of the bit line drops below the VDD level as the result of the operation of another memory cell, the F/F retains the stored data.

In the read-out operation of the memory cell, the potential of the word line $\overline{WL}$ is gradually reduced to ground level by the inverter circuit IV1. The potential of the word line $\overline{WL}$ drops gradually, and when that potential has dropped below the potential (VDD−VJ) (where VJ is the built-in potential at the junction of the diodes D1, D2) the current begins to flow through the diode D2 which is connected to the internal node ND2. The potential of the bit line $\overline{BL}$ which is connected to the diode D2 then starts to decrease from the VDD level, and the potential relationship of the memory cell changes, as shown in FIG. 8(b). This change is detected by the sense amplifier and the recorded data is read.

In the read operation described above, when the derivability of the NMOS N3 in the inverter circuit IV1, which causes the word line $\overline{WL}$ to drop to ground level, is set sufficiently low in comparison with the drivability capacities of the NMOSs N1, N2 in the memory cell, the potential (VND2−VWL) between the internal node ND2 and the word line $\overline{WL}$ becomes smaller than the threshold potential VT of the NMOSs N2. As a result, the memory cell can be operated in a stable manner, even when the NMOSs N1, N2 are the smallest possible size.

In a conventional memory cell, when the size of the drive transistor (NMOS N1, N2) is greater than the size of the transfer gate, it is necessary to make the drivability large, in order to operate the memory cell in a stable manner, because the bit line and the internal node are connected through the NMOS which acts as a transfer gate.

In this embodiment, it is not necessary to have large drive transistors (NMOS N1, N2) for the memory cell because the bit lines (BL, $\overline{BL}$) and the internal nodes (ND1, ND2) are connected through the diodes (D1, D2). Therefore, there is no relation between the size of the drive transistor and the stability of the operation of the memory cell. Accordingly, the size of the memory cell of this embodiment of the present invention can be reduced in comparison with a conventional memory cell.

In the operation of writing into the memory cell of the present embodiment, the write data DIN, $\overline{DIN}$ is provided to the bit lines BL, $\overline{BL}$ through the transistors T3, T4. Next, the potential of the word line $\overline{WL}$, as shown in FIG. 8 (c), is reduced to ground level by the NMOS N4, and the write data DIN, $\overline{DIN}$ is provided to the internal nodes ND1, ND2 through the diodes D1, D2, to complete the operation.

As opposed to the memory cell shown in FIG. 5 in which the load elements L1, L2 are the high resistances R1, R2, in the case where the access operation is performed by use of the peripheral circuit shown in FIG. 7, the relationship of the potentials of the main elements in the memory cell is the same as the relationship of the potentials in the memory cell shown in FIG. 6, with the exception of the drop in the potential of the internal node ND1 as indicated by the dotted line in FIG. 8 (b), and the operation is carried out in the same manner.

In this potential relationship, the potential of the internal node ND1 drops, but by setting the drivability of the NMOS N3 of the inverter circuit IV1 sufficiently small compared with the drivability of the NMOSs N1, N2 of the memory cell, the difference in potential between the internal node ND2 and the word line $\overline{WL}$ can be smaller than the threshold voltages of the NMOSs N1, N2.

Figure 1:
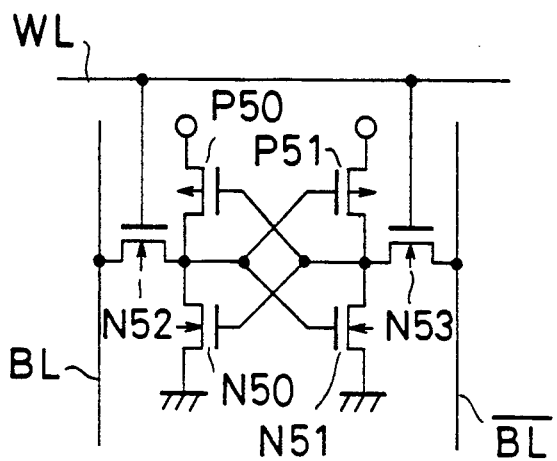
FIGS. 1 to 3 are circuit diagrams of various types of conventional semiconductor memory devices shown as a memory cell.
Figure 2:
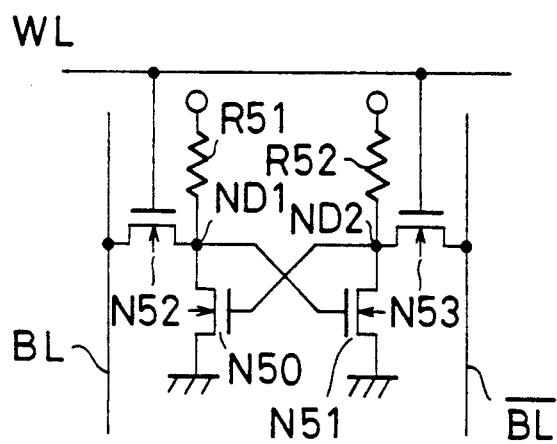
Figure 3:
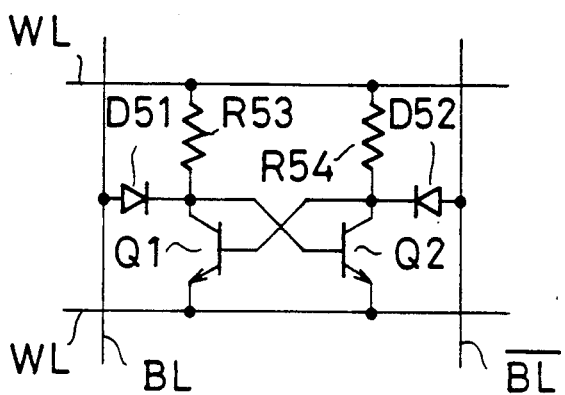

Accordingly, even when the NMOSs N1, N2 are of minimum size, the memory cell can be operated in a stable manner. Accordingly, even the memory cell of the configuration shown in FIG. 2 can be reduced in size.

In the write operation, when data at the high level is written into the internal node ND2, for example, the write potential is (VBL−VJ) when the potential of the bit line BL is VBL. However, the write potential is (VBL−VT) when the threshold voltage of the transfer gate is VT in the conventional resistance load type memory cell.

The size reduction of the transistor brings a large substrate bias effect, so VT becomes greater than VJ when the transistor threshold voltage rises. This is a major disadvantage on the development of transistors of reduced size. Accordingly, (VBL−VJ) becomes greater than (VBL−VT) and, in the above-mentioned embodiment, the write potential of the resistance load type of memory cell is unaffected by the substrate bias and is high in comparison with the write potential of the conventional resistance load type of memory cell. This makes it possible to increase the immunity to soft errors.

Figure 9:
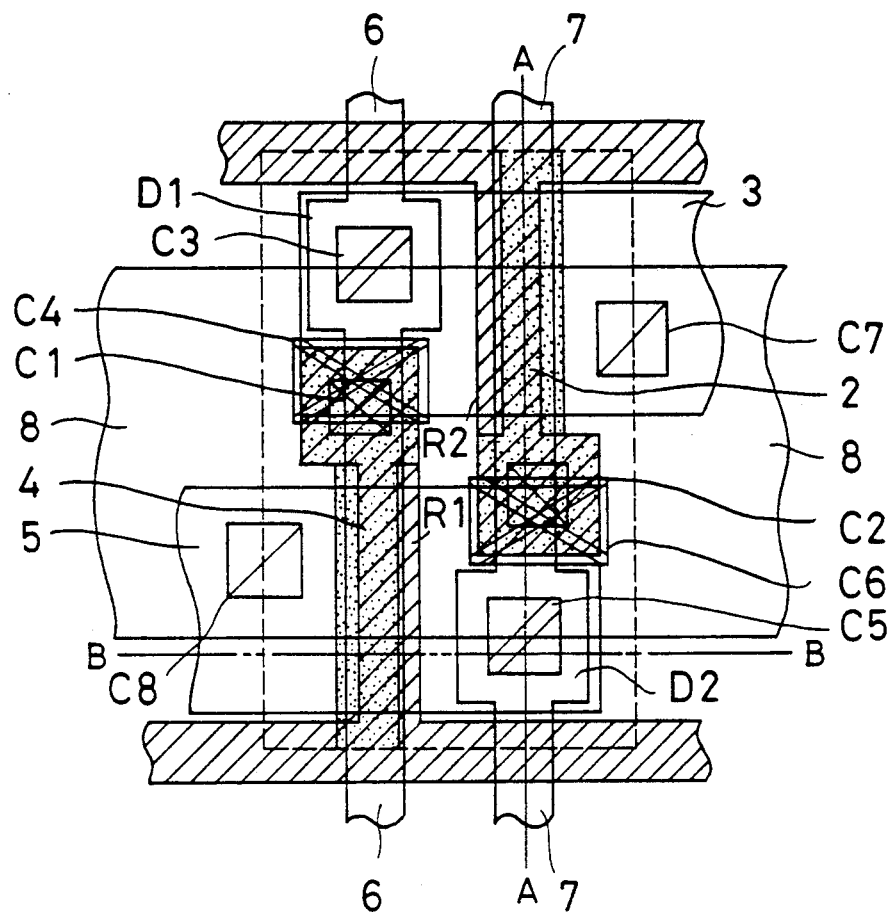
FIG. 9 is a pattern layout for a memory cell showing the configuration of a memory cell used in a semiconductor memory device according to the present invention.
Figure 9:
Figure 9:
Figure 9:
Figure 9:
Figure 10A:
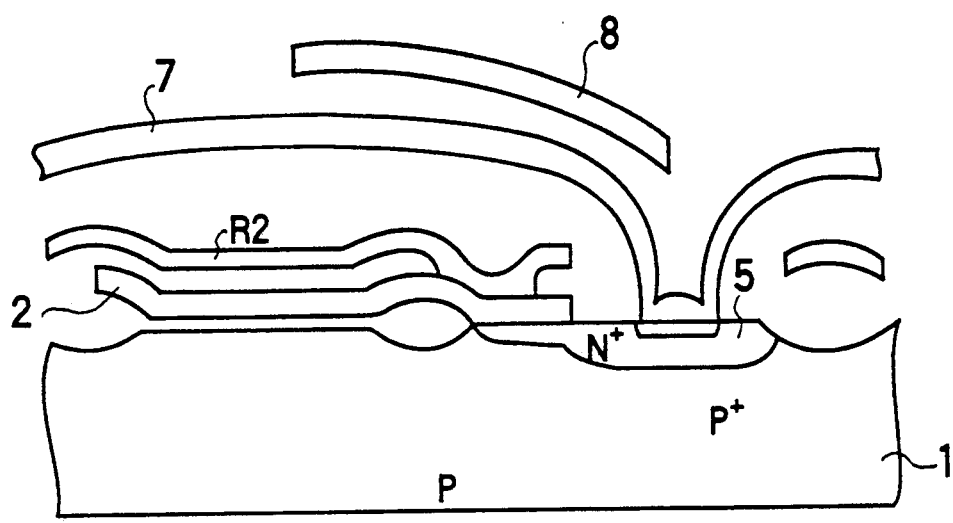
FIGS. 10A and 10B are sectional drawings of the pattern layout viewed along the lines A—A and B—B in FIG. 9.

FIG. 9 shows one example of a pattern layout for the memory cell with the configuration shown in FIG. 5; FIG. 10A is a sectional drawing, viewed along the line A—A in FIG. 9; and FIG. 10B is a sectional drawing, viewed along the line B—B in FIG. 9.

Figure 10B:
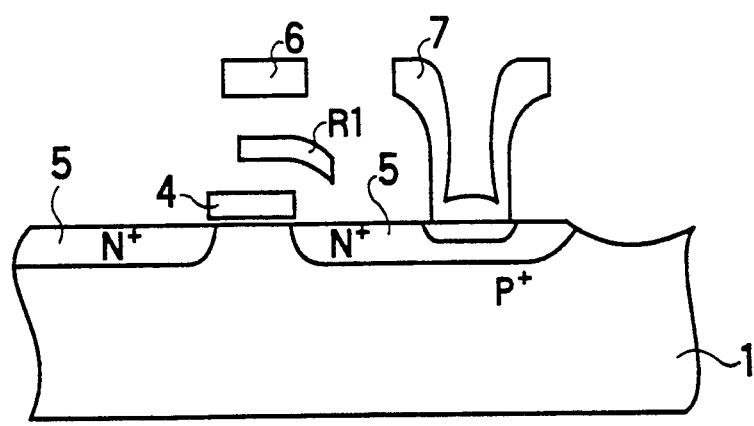

In FIG. 9 and FIGS. 10A, 10B, the memory cell is formed from three layers of polysilicon and one layer of aluminum on a P-type semiconductor substrate 1. A gate electrode 2 of the NMOS N1 is an N+-type formed on the first layer of polysilicon; a source region and a drain region are formed from an N+-type diffusion layer 3. A gate electrode 4 of the NMOS N2 is an N+-type formed on the first layer of polysilicon; a source region and a drain region are formed from an N+-type diffusion layer 5.

The resistances R1, R2 are formed on the second layer of polysilicon. A contact region C2 of the second layer of polysilicon is bonded to a contact region C1 of the first layer of polysilicon. One end of the resistance R1 is connected to the gate electrode 4 of the NMOS N1, and one end of the resistance R2 is connected to the gate electrode 2 of the NMOS N2. The diode D1 is formed by depositing a P+-type of third polysilicon layer 6, which also forms the bit line BL, and an N+-type diffusion layer 3, which forms the drain region of the NMOS N1, at a contact region C3. In addition, the cathode side of the diode D1 is connected to the gate electrode 4 of the NMOS N2 by bonding the N+-type diffusion layer 3 to the first polysilicon layer at an embedded contact region C4.

The diode D2 is formed by depositing a P+-type of polysilicon layer 7, which also forms the bit line BL, and an N+-type diffusion layer 5, which forms the drain region of the NMOS N2, at a contact region C5. In addition, the cathode side of the diode D2 is connected to the gate electrode 2 of the NMOS N1 by bonding the N+-type diffusion layer 5 to the first polysilicon layer at an embedded contact region C6.

Figure 11:
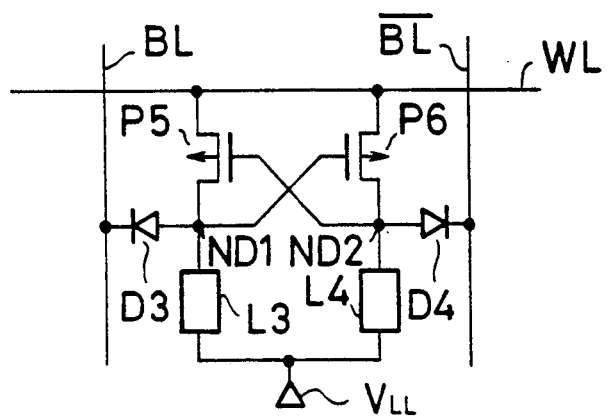
FIGS. 11 to 13 are circuit diagrams of various types of semiconductor memory devices shown as another memory cell according to the present invention.

The word line $\overline{WL}$ is formed from a single aluminum layer 8. The aluminum layer 8 is connected to the diffusion layers 3, 5 at a pair of contact regions C7, C8 respectively, so that the source regions of the NMOSs N1, N2 are connected to the word line $\overline{WL}$;

In the memory cell with this configuration, the cell area of the first memory cell is the region enclosed by the dotted line in FIG. 9, and the diodes D1, D2 can be formed with a size almost equivalent to the size of the contacts. Accordingly, the diodes D1, D2 can be formed with a cell area smaller than the transfer gate of the NMOS used in the conventional memory cell. Accordingly, when comparing under the same design rules, the size of the cell in the memory cell with the above-mentioned layout can be 20% to 30% smaller than the conventional resistance load type of cell. FIG. 11 is a diagram showing the circuit configuration of another embodiment of the memory cell of the present invention.

In FIG. 11, the memory cell comprises a pair of PMOSs P5, P6, a pair of diodes D3, D4, and a pair of load elements L3, L4.

The PMOSs P5, P6 are cross-coupled, and are connected respectively to the internal nodes ND1, ND2 corresponding to a pair of gate terminals. The respective source terminals are connected to the common word line WL. The anode terminals of the diodes D3, D4 are connected to the corresponding internal nodes ND1, ND2, and the cathode terminals are connected to the corresponding word lines BL, $\overline{BL}$. The load elements L1, L2 are connected between the internal nodes ND1, ND2 corresponding to a fixed potential VLL which is lower than ground level.

Figure 12:
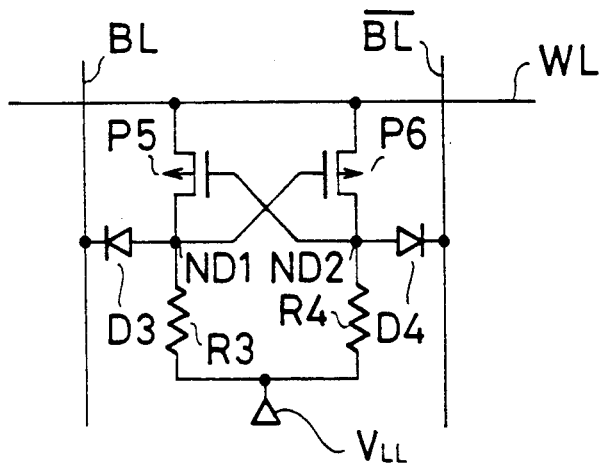
Figure 13:
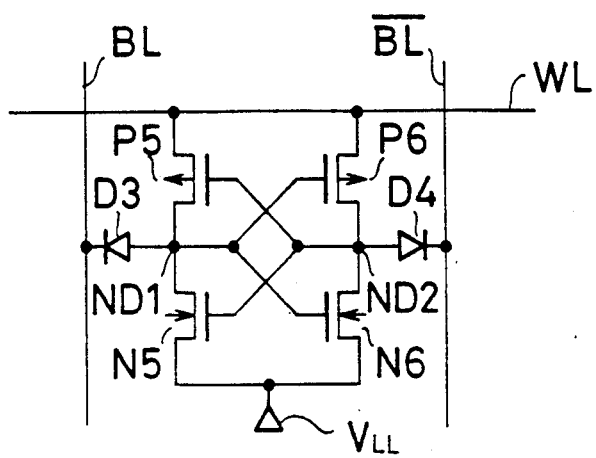

A pair of resistances R3, R4, as shown in FIG. 12, or a pair of cross-coupled NMOSs N5, N6, as shown in FIG. 13, are used as the load elements L3, L4.

With a memory cell of this configuration, in the non-selected state, the word line WL is at the ground potential level, and, in the selected state, at the power line level (VDD). The level prior to accessing the word lines BL, $\overline{BL}$ is the ground level. Accordingly, with this type of memory cell the access operation is also performed in the same manner as for the memory cell of the previously-described embodiment, and the same effect can be obtained.

In this embodiment, the potentials VHH or VLL connected to the load elements L1, L2, L3, L4 are uniform potentials, but this is not essential. If the F/F in the memory cell is provided with the difference in potential which maintains the operation of the F/F, a potential which changes at the same phase as the potential provided to the word line is acceptable.

In such a case, the reliability of the memory cell can be increased because it is possible to neutralize the voltage applied to the memory during the read and write operations.

As can be clearly understood from the foregoing explanation, in the present invention, because the stored data is input and output via the diodes, between the internal node and the bit line, connected to the word line through a cross-coupled drive transistor (MOSFET), under the control of the inverter as the driving means, this cell has high stability, the drive FET can be small, and it is possible to minimize soft error rate when the write potential is high. As a result, a reduction in cell area and an increase in reliability can be provided, so that an ideal semiconductor memory device with a high density can be provided.

Various modification will become possible for those skilled in the art after the teaching of the present disclosure without departing from the scope thereof.

What is claimed is:

1. A semiconductor memory device having a plurality of memory cells, each of said memory cells having two nodes, wherein an electric potential of each of said nodes designates a stored data, comprising:
- a word line;
- a pair of bit lines;
- a pair of field effect transistors (FETs) connected between the word line and the nodes;
- a pair of diodes connected between the bit lines and the nodes;
- a pair of load means connected between the nodes and a first potential; and
- driving means connected to the word line for driving the FETs by gradually reducing the electric potential of the word line to a ground level;
- wherein the difference in electric potential between the nodes and the word line is set to a value which is smaller than the electric potential of the threshold voltages of the FETs, the drivability of the driving means is set to a value which is smaller than that of the FETs, and
- wherein the electric potentials of the nodes are set by the change in potential of the word line under the control of the driving means.

2. A semiconductor memory device according to claim 1, wherein the driving means comprises an inverter.

3. A semiconductor memory device according to claim 1, wherein the FETs are made up of n-channel metal oxide semiconductors, the gate of one FET is connected to one node and the gate of the other FET to the other node, the drains of the FETs are connected to the word line, the anodes of the diodes are connected to the bit lines, and the cathods of which are connected to the nodes.

4. A semiconductor memory device according to claim 2, wherein the load means comprises a resistance.

5. A semiconductor memory device according to claim 2, wherein the load means comprises a p-channel MOS FET.

6. A semiconductor memory device according to claim 1, wherein the load means is made up of p-channel metal oxide semiconductor FET, the gate of one FET is connected to one node and the gate of the other FET to the other node, the drains of the FETs are connected to the word line, the cathods of the diodes are connected to the bit lines, and the anodes of which are connected to the nodes.

7. A semiconductor memory device according to claim 6, wherein the driving means comprises an inverter.

8. A semiconductor memory device according to claim 6, wherein the load means comprises a resistance.

9. A semiconductor memory device according to claim 6, wherein the load means comprises a p-channel MOS FET.

10. A semiconductor memory device according to claim 1, wherein an output potential of the first potential changes at the same phases as the potential provided to the word line.

* * * * *